(12) United States Patent
Shetty et al.

(10) Patent No.: US 11,296,692 B1
(45) Date of Patent: Apr. 5, 2022

(54) POWER-ON RESET CIRCUIT

(71) Applicant: NXP B.V., Eindhoven (NL)

(72) Inventors: Vikas Shetty, Bangalore (IN); Mukul Pancholi, Jaipur (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/302,387

(22) Filed: Apr. 30, 2021

(51) Int. Cl.
*H03K 17/22* (2006.01)
*G05F 3/26* (2006.01)

(52) U.S. Cl.
CPC ........... *H03K 17/223* (2013.01); *G05F 3/262* (2013.01)

(58) Field of Classification Search
None
See application file for complete search history.

(56) References Cited

U.S. PATENT DOCUMENTS

| | | | |
|---|---|---|---|
| 5,485,111 A | 1/1996 | Tanimoto | |
| 7,057,427 B2 | 6/2006 | Wadhwa et al. | |
| 7,812,649 B2 | 10/2010 | Barnett | |
| 7,821,307 B2 | 10/2010 | Chellappa | |
| 8,330,526 B2 * | 12/2012 | Vilas Boas | G06F 1/28 327/512 |
| 8,446,187 B1 | 5/2013 | Burinskiy | |
| 9,557,226 B2 * | 1/2017 | Eberlein | G01K 1/02 |
| 9,882,558 B1 | 1/2018 | Sun et al. | |

FOREIGN PATENT DOCUMENTS

CN 102594312 B 12/2014

* cited by examiner

*Primary Examiner* — Jeffery S Zweizig (57) ABSTRACT

A power-on reset circuit includes a complementary-to-absolute-temperature circuit that outputs one control voltage, and a proportional-to-absolute-temperature (PTAT) circuit that outputs a PTAT current. The power-on reset circuit further includes various resistors that are coupled in series, and generate another control voltage based on the PTAT current that is outputted by the PTAT circuit. Further, the power-on reset circuit includes a comparator that compares the two control voltages to generate a power-on reset signal. The power-on reset signal is activated when a supply voltage is greater than or equal to a trip voltage, and deactivated when the supply voltage is less than the trip voltage. A functional circuit is configured to execute a reset operation associated therewith when the power-on reset signal transitions from a deactivated state to an activated state.

19 Claims, 5 Drawing Sheets

POWER-ON RESET CIRCUIT

BACKGROUND

The present disclosure relates generally to electronic circuits, and, more particularly, to a power-on reset circuit.

An electronic system (such as a system-on-chip, a printed circuit board, or the like) includes various functional circuits (such as flip-flops, counters, or the like) that require a predetermined voltage level of a supply voltage for executing associated operations. Such a predetermined voltage level of the supply voltage is referred to as a trip voltage. If the functional circuits operate at the supply voltage that is less than the trip voltage, erroneous output may be generated. Hence, when the electronic system is powered up, the functional circuits are non-operational (i.e., are in undesired states) until the supply voltage is equal to the trip voltage. Typically, the electronic system includes a power-on reset circuit that receives the supply voltage and generates a power-on reset signal such that the power-on reset signal is activated when the supply voltage is greater than or equal to the trip voltage, and deactivated when the supply voltage is less than the trip voltage. In such a scenario, when the power-on reset signal transitions from a deactivated state to an activated state (i.e., when the supply voltage becomes equal to the trip voltage), the functional circuits are reset and can then operate in a desired manner.

Typically, the power-on reset circuit can operate at low voltage levels of the supply voltage (e.g., 1.8 volts). As the supply voltage scales up (e.g., 3.6 volts, 5 volts, or the like), a current in the power-on reset circuit increases. Conventionally, to compensate for the increased current, resistors of significant resistance values (e.g., 10 mega-ohms) are utilized. Such resistors result in a significant increase in a size and a manufacturing cost of the power-on reset circuit, and in turn, in a size and a manufacturing cost of the electronic system. Therefore, there exists a need for a technical solution that solves the aforementioned problems of existing power-on reset circuits.

SUMMARY

In an embodiment of the present disclosure, a power-on reset circuit is disclosed. The power-on reset circuit can include a complementary-to-absolute-temperature (CTAT) circuit, a proportional-to-absolute-temperature (PTAT) circuit, and a comparator. The CTAT circuit can be configured to output a first control voltage, and the PTAT circuit can be configured to output a first PTAT current. The comparator can be coupled with the CTAT circuit, and configured to receive the first control voltage and a second control voltage that is generated based on the first PTAT current, and compare the first and second control voltages to generate a power-on reset signal.

In another embodiment of the present disclosure, an electronic system is disclosed. The electronic system can include a power-on reset circuit and a functional circuit coupled with the power-on reset circuit. The power-on reset circuit can include a CTAT circuit that can be configured to output a first control voltage, and a PTAT circuit that can be configured to output a first PTAT current. The power-on reset circuit can further include a comparator that can be coupled with the CTAT circuit, and configured to receive the first control voltage and a second control voltage that is generated based on the first PTAT current. The comparator can be further configured to compare the first and second control voltages to generate a power-on reset signal. The functional circuit can be configured to receive the power-on reset signal from the power-on reset circuit, and execute a reset operation associated therewith.

In some embodiments, the CTAT circuit can correspond to one of a diode and a diode-connected transistor.

In some embodiments, the PTAT circuit can include a first resistor that can be configured to receive a supply voltage, and first and second transistors each having first through third terminals. The first terminal of the first transistor can be configured to receive the supply voltage and the first terminal of the second transistor can be coupled with the first resistor. The second terminal of the second transistor can be coupled with the second and third terminals of the first transistor. The third terminals of the first and second transistors can be configured to output second and third PTAT currents, respectively. The PTAT circuit can further include third and fourth transistors each having first through third terminals. The first terminals of the third and fourth transistors can be coupled with a ground terminal, and the second terminal of the third transistor can be coupled with the second and third terminals of the fourth transistor. The third terminals of the third and fourth transistors can be coupled with the third terminals of the first and second transistors, respectively. The PTAT circuit can further include fifth and sixth transistors each having first through third terminals. The second terminals of the fifth and sixth transistors can be coupled with the second terminals of the first and fourth transistors, respectively. The first terminal of the fifth transistor can be configured to receive the supply voltage, and the first terminal of the sixth transistor can be coupled with the ground terminal.

In some embodiments, the third terminals of the fifth and sixth transistors can be configured to output the first PTAT current and a fourth PTAT current, respectively. The first and fourth PTAT currents can be scaled versions of the second and third PTAT currents, respectively. The third terminal of the sixth transistor can be coupled with the CTAT circuit, and can output the fourth PTAT current such that the fourth PTAT current is sank from the CTAT circuit. Further, the CTAT circuit is configured to receive the supply voltage. The CTAT circuit can output the first control voltage based on the fourth PTAT current and the supply voltage.

In some embodiments, the power-on reset circuit can further include second and third resistors coupled in series with each other. The third resistor can be further coupled with the ground terminal. The second resistor can be further coupled with the third terminal of the fifth transistor, and configured to receive the first PTAT current and generate the second control voltage.

In some embodiments, the power-on reset circuit can further include a first switch coupled in parallel with the third resistor. The first switch can be further coupled with the comparator, and configured to receive the power-on reset signal. The first switch can be activated and deactivated when the power-on reset signal is activated and deactivated, respectively. The power-on reset signal can be activated when the first control voltage is greater than or equal to the second control voltage. Further, when the first control voltage is less than the second control voltage, the power-on reset signal can be deactivated.

In some embodiments, the third terminals of the fifth and sixth transistors can be configured to output a fifth PTAT current and the first PTAT current, respectively. The fifth and first PTAT currents can be scaled versions of the second and third PTAT currents, respectively. The third terminal of the fifth transistor can be coupled with the CTAT circuit, and further configured to provide the fifth PTAT current to the CTAT circuit. The CTAT circuit can output the first control voltage based on the fifth PTAT current.

In some embodiments, the power-on reset circuit can further include fourth and fifth resistors coupled in series with each other. The fifth resistor can be configured to receive the supply voltage and the fourth resistor can be further coupled with the third terminal of the sixth transistor. The third terminal of the sixth transistor can output the first PTAT current such that the first PTAT current is sank from the fourth resistor. The fourth resistor can be configured to generate the second control voltage based on the first PTAT current.

In some embodiments, the power-on reset circuit can further include a second switch coupled in parallel with the fifth resistor. The second switch can be further coupled with the comparator, and configured to receive the power-on reset signal. The second switch can be activated and deactivated when the power-on reset signal is activated and deactivated, respectively. The power-on reset signal can be activated when the second control voltage is greater than or equal to the first control voltage. When the second control voltage is less than the first control voltage, the power-on reset signal can be deactivated.

In some embodiments, the PTAT circuit can include seventh through tenth transistors each having first through third terminals. The first terminals of the seventh and eighth transistors can be configured to receive the supply voltage. The second terminal of the seventh transistor can be coupled with the second and third terminals of the eighth transistor. The third terminals of the seventh and eighth transistors can be configured to output sixth and seventh PTAT currents, respectively. The first terminals of the ninth and tenth transistors can be coupled with the ground terminal. The second terminal of the ninth transistor can be coupled with the third terminals of the ninth and seventh transistors, and the second terminal of the tenth transistor can be coupled with the third terminal of the tenth transistor. The PTAT circuit can further include a sixth resistor that can be coupled between the third terminals of the eighth and tenth transistors, and configured to generate a first reference voltage. The PTAT circuit can further include an amplifier that can be coupled with the sixth resistor and the third terminal of the ninth transistor, and configured to receive the first reference voltage and a second reference voltage, respectively, and generate a third reference voltage. The second reference voltage can correspond to a base-emitter voltage of the ninth transistor. The amplifier can be further coupled with the second terminals of the seventh and eighth transistors, and further configured to provide the third reference voltage to the second terminals of the seventh and eighth transistors.

In some embodiments, the PTAT circuit can further include eleventh through fourteenth transistors each having first through third terminals. The first terminal of the eleventh transistor can be configured to receive the supply voltage, the second terminal of the eleventh transistor can be coupled with the second and third terminals of the eighth transistor, and the third terminal of the eleventh transistor can be configured to output an eighth PTAT current. The first terminal of the twelfth transistor can be coupled with the ground terminal and the second and third terminals of the twelfth transistor can be coupled with the third terminal of the eleventh transistor. The second terminals of the thirteenth and fourteenth transistors can be coupled with the second terminals of the twelfth and seventh transistors, respectively. The first terminal of the fourteenth transistor can be configured to receive the supply voltage, and the first terminal of the thirteenth transistor can be coupled with the ground terminal.

In some embodiments, the third terminals of the thirteenth and fourteenth transistors can be configured to output a ninth PTAT current and the first PTAT current, respectively. The ninth and first PTAT currents can be scaled versions of the eighth and sixth PTAT currents, respectively. The third terminal of the thirteenth transistor can be coupled with the CTAT circuit, and can output the ninth PTAT current such that the ninth PTAT current is sank from the CTAT circuit. The CTAT circuit is configured to receive the supply voltage. The CTAT circuit can output the first control voltage based on the ninth PTAT current and the supply voltage.

In some embodiments, the power-on circuit can further include seventh and eighth resistors coupled in series with each other. The eighth resistor can be further coupled with the ground terminal. The seventh resistor can be further coupled with the third terminal of the fourteenth transistor, and configured to receive the first PTAT current and generate the second control voltage.

In some embodiments, the power-on circuit can further include a third switch that can be coupled in parallel with the eighth resistor. The third switch can be further coupled with the comparator, and configured to receive the power-on reset signal. The third switch can be activated and deactivated when the power-on reset signal is activated and deactivated, respectively. The power-on reset signal can be activated when the first control voltage is greater than or equal to the second control voltage. When the first control voltage is less than the second control voltage, the power-on reset signal can be deactivated.

In some embodiments, the third terminals of the thirteenth and fourteenth transistors can be configured to output the first PTAT current and a tenth PTAT current, respectively. The first and tenth PTAT currents can be scaled versions of the eighth and sixth PTAT currents, respectively. The third terminal of the fourteenth transistor can be coupled with the CTAT circuit, and further configured to provide the tenth PTAT current to the CTAT circuit. The CTAT circuit can output the first control voltage based on the tenth PTAT current.

In some embodiments, the power-on circuit can further include ninth and tenth resistors coupled in series with each other. The tenth resistor can be configured to receive the supply voltage. The ninth resistor can be further coupled with the third terminal of the thirteenth transistor. The third terminal of the thirteenth transistor can output the first PTAT current such that the first PTAT current is sank from the ninth resistor. The ninth resistor can be configured to generate the second control voltage based on the first PTAT current.

In some embodiments, the power-on circuit can further include a fourth switch coupled in parallel with the tenth resistor. The fourth switch can be further coupled with the comparator, and configured to receive the power-on reset signal. The fourth switch can be activated and deactivated when the power-on reset signal is activated and deactivated, respectively. The power-on reset signal can be activated when the second control voltage is greater than or equal to the first control voltage. When the second control voltage is less than the first control voltage, the power-on reset signal can be deactivated.

Various embodiments of the present disclosure disclose an electronic system that can include a power-on reset circuit and a functional circuit coupled with the power-on reset circuit. The power-on reset circuit can include a CTAT circuit that can be configured to output one control voltage, and a PTAT circuit that can be configured to output a PTAT current. The power-on reset circuit can further include various resistors that can be coupled in series, and configured to generate another control voltage based on the PTAT current outputted by the PTAT circuit. Further, the power-on reset circuit can include a comparator that can be configured to compare the two control voltages to generate a power-on reset signal. The functional circuit can be configured to receive the power-on reset signal from the comparator, and execute a reset operation associated therewith.

Thus, the power-on reset circuit of the present disclosure can generate the power-on reset signal for facilitating a reset of the functional circuit when a supply voltage is equal to a trip voltage. The PTAT circuit ensures that the PTAT current in the power-on reset circuit is independent of the supply voltage. In other words, an increase in the supply voltage does not result in an increase in the PTAT current in the power-on reset circuit of the present disclosure. As a result, a need to implement various current compensation techniques to compensate for any additional current is eliminated. Hence, a size and a manufacturing cost of the power-on reset circuit of the present disclosure are significantly less than that of a conventional power-on reset circuit that requires resistors of significant resistance values to compensate for an increased current therein that is a result of an increase in the supply voltage. Consequently, a size and a manufacturing cost of an electronic system that includes the power-on reset circuit of the present disclosure are significantly less than that of an electronic system that includes the conventional power-on reset circuit.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
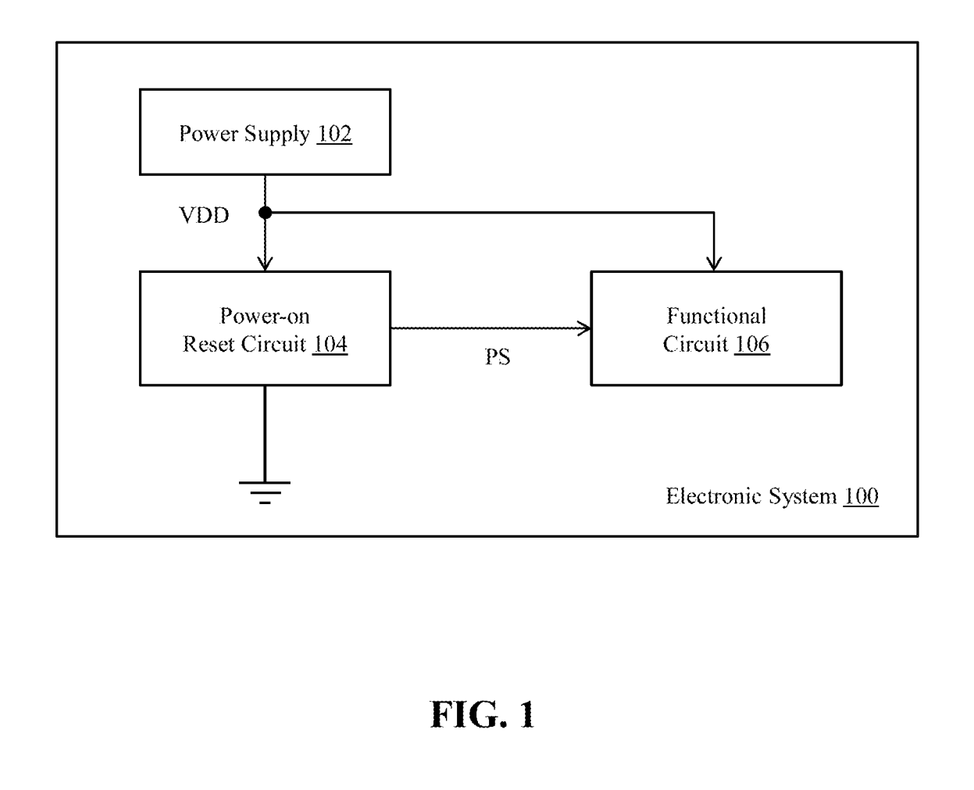
FIG. 1 illustrates a schematic block diagram of an electronic system in accordance with an embodiment of the present disclosure.

FIG. 1 illustrates a schematic block diagram of an electronic system 100 in accordance with an embodiment of the present disclosure. The electronic system 100 can include a power supply 102 that can be configured to generate a supply voltage VDD. The electronic system 100 can further include a power-on reset circuit 104 and a functional circuit 106. In one embodiment, the electronic system 100 corresponds to a system-on-chip. In another embodiment, the electronic system 100 corresponds to a printed circuit board. The electronic system 100 can be included in various devices such as automotive devices, network devices, or the like.

The power-on reset circuit 104 can be coupled between the power supply 102 and a ground terminal. The power-on reset circuit 104 can be configured to receive the supply voltage VDD from the power supply 102, and generate a power-on reset signal PS. In an embodiment, the power-on reset circuit 104 activates the power-on reset signal PS (i.e., generates the power-on reset signal PS at a logic high state) when the supply voltage VDD is greater than or equal to a trip voltage (not shown), and deactivates the power-on reset signal PS (i.e., generates the power-on reset signal PS at a logic low state) when the supply voltage VDD is less than the trip voltage. The trip voltage can correspond to a minimum voltage level of the supply voltage VDD that is required by the functional circuit 106 for executing associated operations. In an example, the trip voltage is equal to 1.2 volts. The power-on reset circuit 104 is explained in detail in conjunction with FIGS. 2A-2D.

The functional circuit 106 can be coupled with the power supply 102 and the power-on reset circuit 104. The functional circuit 106 can include suitable circuitry that can be configured to perform one or more operations. For example, the functional circuit 106 can be configured to receive the power-on reset signal PS and the supply voltage VDD from the power-on reset circuit 104 and the power supply 102, respectively. Based on the power-on reset signal PS and the supply voltage VDD, the functional circuit 106 can be further configured to execute a reset operation associated therewith. In an embodiment, the functional circuit 106 executes the reset operation associated therewith when the power-on reset signal PS transitions from a deactivated state to an activated state. Examples of the functional circuit 106 can include flip-flops, counters, or the like.

Figure 2A:
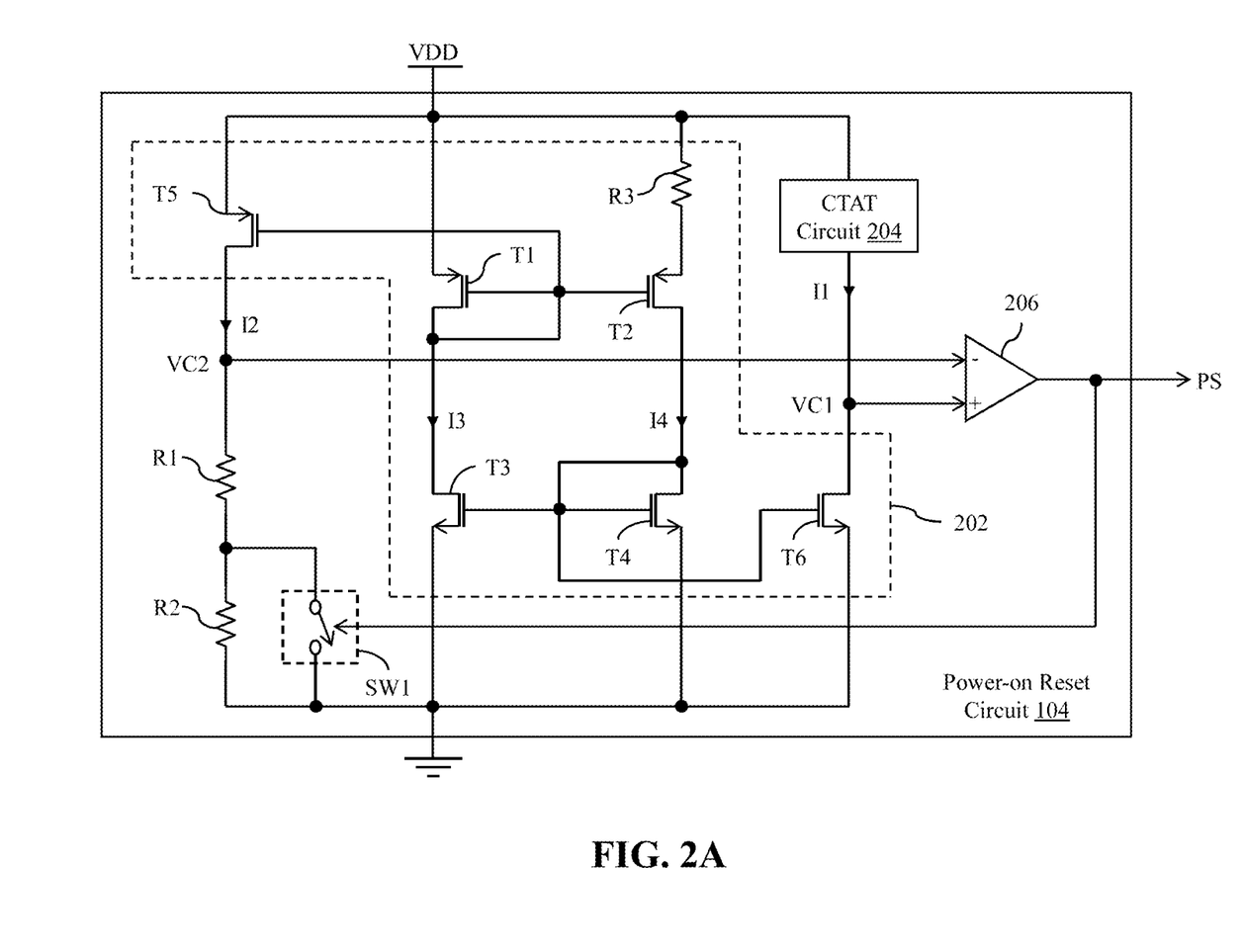
FIG. 2A illustrates a schematic circuit diagram of a power-on reset circuit of the electronic system of FIG. 1 in accordance with an embodiment of the present disclosure.

FIG. 2A illustrates a schematic circuit diagram of the power-on reset circuit 104 in accordance with an embodiment of the present disclosure. The power-on reset circuit 104 can include a first proportional-to-absolute-temperature (PTAT) circuit 202, a complementary-to-absolute-temperature (CTAT) circuit 204, first and second resistors R1 and R2, a first switch SW1, and a comparator 206.

The first PTAT circuit 202 can be configured to output first and second PTAT currents I1 and I2. The first PTAT circuit 202 can include a third resistor R3 that has first and second terminals. The first terminal of the third resistor R3 can be coupled with the power supply 102, and configured to receive the supply voltage VDD. The first PTAT circuit 202 can further include first through sixth transistors T1-T6.

The first and second transistors T1 and T2 each have first through third terminals. The first terminal of the first transistor T1 can be coupled with the power supply 102, and configured to receive the supply voltage VDD, and the first terminal of the second transistor T2 can be coupled with the second terminal of the third resistor R3. The second terminal of the second transistor T2 can be coupled with the second and third terminals of the first transistor T1. Further, the third terminals of the first and second transistors T1 and T2 can be configured to output third and fourth PTAT currents I3 and I4, respectively. In an embodiment, the first and second transistors T1 and T2 are p-channel metal-oxide semiconductor (PMOS) transistors, and the first through third terminals of the first and second transistors T1 and T2 correspond to source, gate, and drain terminals, respectively. The first and second transistors T1 and T2 thus form a first current mirror. Further, a size of the second transistor T2 is 'N' times a size of the first transistor T1. In an embodiment, 'N' is greater than one.

The third and fourth transistors T3 and T4 each have first through third terminals. The first terminals of the third and fourth transistors T3 and T4 can be coupled with the ground terminal, and the second terminal of the third transistor T3 can be coupled with the second and third terminals of the fourth transistor T4. Further, the third terminals of the third and fourth transistors T3 and T4 can be coupled with the third terminals of the first and second transistors T1 and T2, respectively. In an embodiment, the third and fourth transistors T3 and T4 are n-channel metal-oxide semiconductor (NMOS) transistors, and the first through third terminals of the third and fourth transistors T3 and T4 correspond to source, gate, and drain terminals, respectively. The third and fourth transistors T3 and T4 thus form a second current mirror. Further, sizes of the third and fourth transistors T3 and T4 are equal.

When the first and second transistors T1 and T2 operate in a subthreshold region of operation, a voltage drop across the third resistor R3 is temperature-dependent and independent of the supply voltage VDD. The voltage drop across the third resistor R3 can be determined as shown below in equation (1):

$$V_{R3} = \frac{k*T*\ln(N)}{q} \quad (1)$$

where,
$V_{R3}$ is the voltage drop across the third resistor R3,
k is the Boltzmann constant,
T is the temperature,
N is a ratio of sizes of the second and first transistors T2 and T1, and
q is the charge of an electron.

In an example, the voltage drop across the third resistor R3 is 25 millivolts. As the voltage drop across the third resistor R3 is a PTAT voltage, a current passing through the third resistor R3 is a PTAT current. The fourth PTAT current I4 is thus outputted, and can be determined as shown below in equation (2):

$$I4 = \frac{k*T*\ln(N)}{q*R3} \quad (2)$$

The pair of stacked current mirrors (i.e., the first and second current mirrors) drive the third PTAT current I3 to be equal to the fourth PTAT current I4.

The fifth and sixth transistors T5 and T6 each have first through third terminals. The second terminals of the fifth and sixth transistors T5 and T6 can be coupled with the second terminals of the first and fourth transistors T1 and T4, respectively. Further, the first terminal of the fifth transistor T5 can be coupled with the power supply 102, and configured to receive the supply voltage VDD, and the first terminal of the sixth transistor T6 can be coupled with the ground terminal. The third terminals of the fifth and sixth transistors T5 and T6 can be configured to output the second and first PTAT currents I2 and I1, respectively. The third terminal of the sixth transistor T6 can be coupled with the CTAT circuit 204, and can output the first PTAT current I1 such that the first PTAT current I1 is sank from the CTAT circuit 204. Further, the third terminal of the fifth transistor T5 can be coupled with the first resistor R1, and configured to provide (i.e., source) the second PTAT current I2 to the first resistor R1. In an embodiment, the fifth and sixth transistors T5 and T6 are PMOS and NMOS transistors, respectively. Further, the first through third terminals of the fifth and sixth transistors T5 and T6 correspond to source, gate, and drain terminals, respectively.

The first and fifth transistors T1 and T5 thus form a third current mirror. Similarly, the fourth and sixth transistors T4 and T6 form a fourth current mirror. Further, a size of the fifth transistor T5 can be different than that of the first transistor T1, and a size of the sixth transistor T6 can be different than that of the fourth transistor T4. As a result, the first and second PTAT currents I1 and I2 can be scaled versions of the fourth and third PTAT currents I4 and I3, respectively. For the sake of ongoing discussion, it is assumed that the first and second PTAT currents I1 and I2 are 'S1' and 'S2' times the fourth and third PTAT currents I4 and I3, where 'S1' and 'S2' are first and second scaling factors, respectively. In one embodiment, the first and second scaling factors 'S1' and 'S2' are less than one. In another embodiment, the first and second scaling factors 'S1' and 'S2' are greater than one.

The CTAT circuit 204 can be coupled with the power supply 102, and configured to receive the supply voltage VDD. The CTAT circuit 204 can be further coupled with the third terminal of the sixth transistor T6. The coupling between the third terminal of the sixth transistor T6 and the CTAT circuit 204 can be such that the first PTAT current I1 outputted by the third terminal of the sixth transistor T6 is sank from the CTAT circuit 204. Based on the first PTAT current I1 and the supply voltage VDD, the CTAT circuit 204 can be configured to output a first control voltage VC1. In such a scenario, the first PTAT current I1 can correspond to a biasing current that controls an operation of the CTAT circuit 204. In an embodiment, when the first PTAT current I1 is greater than or equal to a first predefined value (not shown), the CTAT circuit 204 is activated (i.e., is operational). Further, when the first PTAT current I1 is less than the first predefined value, the CTAT circuit 204 is deactivated (i.e., is non-operational). Further, the first control voltage VC1 is equal to a difference between the supply voltage VDD and a threshold voltage (not shown) associated with the CTAT circuit 204. The first control voltage VC1 can be determined as shown below in equation (3):

$$VC1=VDD-VT \quad (3)$$

where,
VT is the threshold voltage associated with the CTAT circuit 204.

The threshold voltage associated with the CTAT circuit 204 is a CTAT voltage. Hence, the first control voltage VC1 is a PTAT voltage. The CTAT circuit 204 can correspond to one of a diode and a diode-connected transistor. Examples of the diode-connected transistor can include, but are not limited to, a diode-connected NMOS transistor, a diode-connected PMOS transistor, a diode-connected NPN transistor, and a diode-connected PNP transistor. Although it is described that the CTAT circuit 204 can correspond to a single diode or a single diode-connected transistor, it will be apparent to a person skilled in the art that the scope of the present disclosure is not limited to it. In various other embodiments, the CTAT circuit 204 can correspond to a combination (e.g., a series combination) of multiple diodes or multiple diode-connected transistors, without deviating from the scope of the present disclosure. In such a scenario, the threshold voltage associated with the CTAT circuit 204 can be equal to a sum of threshold voltages of all the diodes or all the diode-connected transistors that constitute the CTAT circuit 204.

The first and second resistors R1 and R2 each have first and second terminals. The first and second resistors R1 and R2 can be coupled in series with each other. In other words, the first terminals of the first and second resistors R1 and R2 can be coupled with each other. Further, the second terminal of the second resistor R2 can be coupled with the ground terminal. The second terminal of the first resistor R1 can be coupled with the third terminal of the fifth transistor T5, and configured to receive the second PTAT current I2 and generate a second control voltage VC2. The second control voltage VC2 can be determined as shown below in equation (4):

$$VC2 = \frac{S2 * k * T * \ln(N) * (R1 + R2)}{q * R3} \quad (4)$$

where, $$\frac{S2 * k * T * \ln(N)}{q * R3}$$

is equal to the second PTAT current I2.

The second control voltage VC2 is thus a PTAT voltage.

The first switch SW1 has first and second data terminals that can be coupled with the first and second terminals of the second resistor R2, respectively. In other words, the first switch SW1 can be coupled in parallel with the second resistor R2. Further, the first switch SW1 has a control terminal that can be configured to receive the power-on reset signal PS. The power-on reset signal PS can control an operation of the first switch SW1. The first switch SW1 can correspond to a PMOS transistor, an NMOS transistor, a transmission gate, or the like. In an embodiment, the first switch SW1 is activated and deactivated when the power-on reset signal PS is activated and deactivated, respectively. When the first switch SW1 is activated, the second resistor R2 is bypassed (i.e., shorted). In such a scenario, the second control voltage VC2 can be determined as shown below in equation (5):

$$VC2 = \frac{S2 * k * T * \ln(N) * R1}{q * R3} \quad (5)$$

The comparator 206 can be coupled with the CTAT circuit 204 and the second terminal of the first resistor R1. The comparator 206 can include suitable circuitry that can be configured to perform one or more operations. For example, the comparator 206 can be configured to receive the first and second control voltages VC1 and VC2 from the CTAT circuit 204 and the second terminal of the first resistor R1, respectively. The comparator 206 can be further configured to compare the first and second control voltages VC1 and VC2 to generate the power-on reset signal PS. The power-on reset signal PS is activated when the first control voltage VC1 is greater than or equal to the second control voltage VC2. Further, the power-on reset signal PS is deactivated when the first control voltage VC1 is less than the second control voltage VC2. The comparator 206 can be further coupled with the functional circuit 106 and the control terminal of the first switch SW1, and further configured to provide the power-on reset signal PS to the functional circuit 106 and the control terminal of the first switch SW1.

In operation, when the electronic system 100 is powered up, the supply voltage VDD ramps up, thereby increasing the first control voltage VC1 (as shown in equation (3)). However, the first control voltage VC1 is less than the second control voltage VC2 that is constant at a first predetermined voltage level (as shown in equation (4)). Thus, the power-on reset signal PS is deactivated when the supply voltage VDD ramps up on the power-up of the electronic system 100. The comparator 206 can provide the power-on reset signal PS to the functional circuit 106 and the control terminal of the first switch SW1.

When the supply voltage VDD ramps up to a voltage level that is equal to the trip voltage, the second control voltage VC2 becomes equal to the first control voltage VC1. As a result, the power-on reset signal PS is activated. Based on equations (3) and (4), the trip voltage can be determined as shown below in equation (6):

$$V_{trip} = VT + \frac{S2 * k * T * \ln(N) * (R1 + R2)}{q * R3} \quad (6)$$

where, $V_{trip}$ is the trip voltage.

The threshold voltage associated with the CTAT circuit 204 is a CTAT voltage (i.e., has a negative temperature co-efficient), whereas the second control voltage VC2 is a PTAT voltage (i.e., has a positive temperature co-efficient). Thus, based on resistance values of the first through third resistors R1-R3, the ratio of the sizes of the second and first transistors T2 and T1, and the second scaling factor 'S2', a temperature-independent trip voltage can be generated.

The functional circuit 106 executes the reset operation associated therewith when the power-on reset signal PS transitions from a deactivated state to an activated state. Further, as the power-on reset signal PS is activated, the first switch SW1 is activated. Hence, the second resistor R2 is bypassed, and the second control voltage VC2 decreases (as shown in equation (5)). In other words, the trip voltage decreases. This ensures that fluctuations in the supply voltage VDD do not result in erroneous toggling of the power-on reset signal PS. The power-on reset signal PS can then be deactivated when the supply voltage VDD ramps down and is equal to the reduced trip voltage.

Figure 2B:
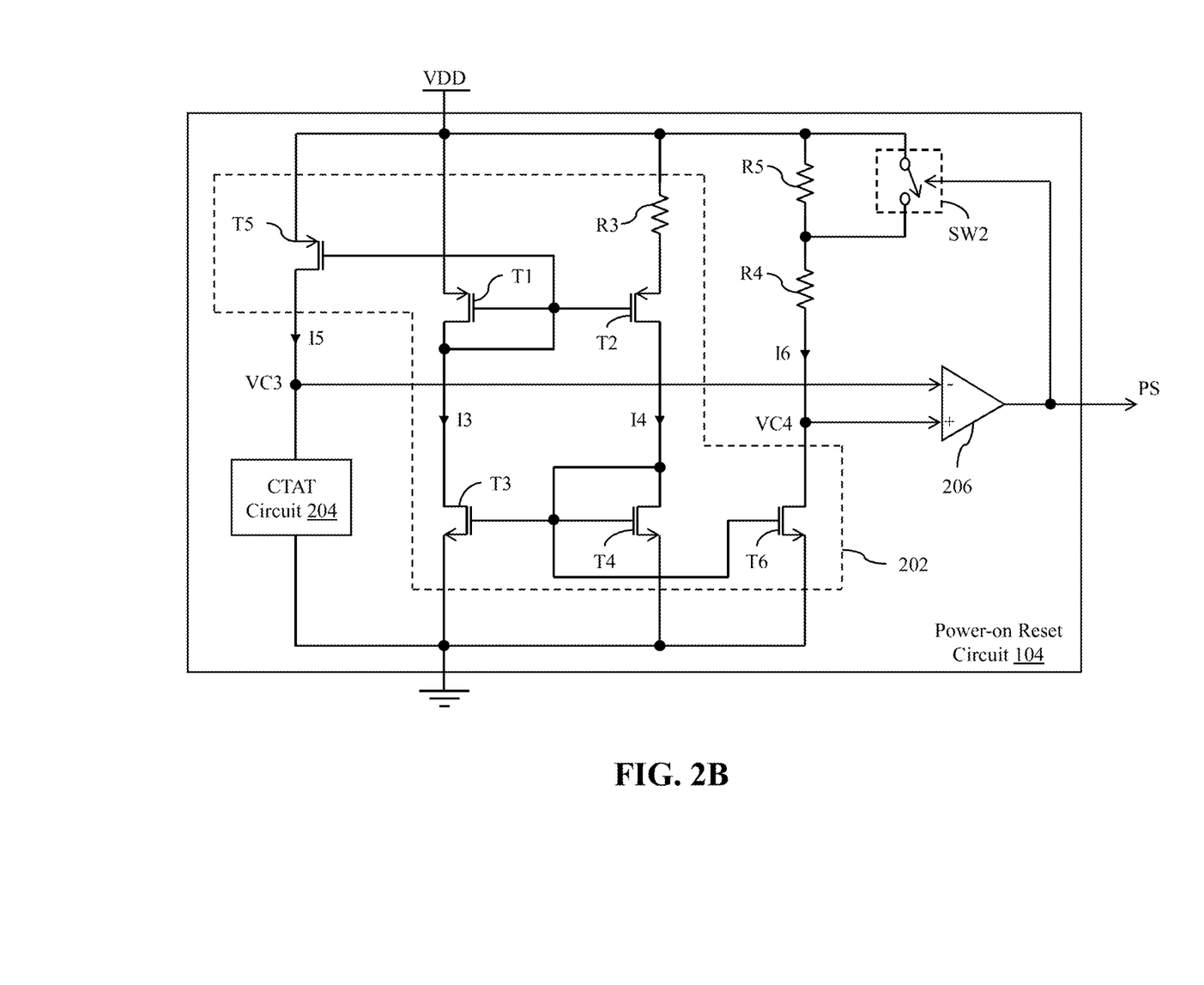
FIG. 2B illustrates a schematic circuit diagram of the power-on reset circuit in accordance with another embodiment of the present disclosure.

FIG. 2B illustrates a schematic circuit diagram of the power-on reset circuit 104 in accordance with another embodiment of the present disclosure. The power-on reset circuit 104 can include the first PTAT circuit 202, the CTAT circuit 204, fourth and fifth resistors R4 and R5, a second switch SW2, and the comparator 206.

The first PTAT circuit 202 can be configured to output fifth and sixth PTAT currents I5 and I6. The first PTAT circuit 202 can include the third resistor R3 and the first through sixth transistors T1-T6.

The first terminal of the third resistor R3 can be coupled with the power supply 102, and configured to receive the supply voltage VDD. The first terminal of the first transistor T1 can be coupled with the power supply 102, and configured to receive the supply voltage VDD, and the first terminal of the second transistor T2 can be coupled with the second terminal of the third resistor R3. The second terminal of the second transistor T2 can be coupled with the second and third terminals of the first transistor T1. Further, the third terminals of the first and second transistors T1 and T2 can be configured to output the third and fourth PTAT currents I3 and I4, respectively. The first terminals of the third and fourth transistors T3 and T4 can be coupled with the ground terminal, and the second terminal of the third transistor T3 can be coupled with the second and third terminals of the fourth transistor T4. Further, the third terminals of the third and fourth transistors T3 and T4 can be coupled with the third terminals of the first and second transistors T1 and T2, respectively.

The second terminals of the fifth and sixth transistors T5 and T6 can be coupled with the second terminals of the first and fourth transistors T1 and T4, respectively. Further, the first terminal of the fifth transistor T5 can be coupled with the power supply 102, and configured to receive the supply voltage VDD, and the first terminal of the sixth transistor T6 can be coupled with the ground terminal. The third terminals of the fifth and sixth transistors T5 and T6 can be configured to output the fifth and sixth PTAT currents I5 and I6, respectively. The third terminal of the sixth transistor T6 can be coupled with the fourth resistor R4, and can output the sixth PTAT current I6 such that the sixth PTAT current I6 is sank from the fourth resistor R4. Further, the third terminal of the fifth transistor T5 can be coupled with the CTAT circuit 204, and configured to provide (i.e., source) the fifth PTAT current I5 to the CTAT circuit 204. The fifth and sixth PTAT currents I5 and I6 can be scaled versions of the third and fourth PTAT currents I3 and I4, respectively. For the sake of ongoing discussion, it is assumed that the fifth and sixth PTAT currents I5 and I6 are 'S3' and 'S4' times the third and fourth PTAT currents I3 and I4, where 'S3' and 'S4' are third and fourth scaling factors, respectively. In one embodiment, the third and fourth scaling factors 'S3' and 'S4' are less than one. In another embodiment, the third and fourth scaling factors 'S3' and 'S4' are greater than one.

The CTAT circuit 204 can be coupled between the third terminal of the fifth transistor T5 and the ground terminal. The CTAT circuit 204 can be configured to receive the fifth PTAT current I5 and output a third control voltage VC3. In such a scenario, the fifth PTAT current I5 can correspond to a biasing current that controls an operation of the CTAT circuit 204. In an embodiment, when the fifth PTAT current I5 is greater than or equal to a second predefined value (not shown), the CTAT circuit 204 is activated (i.e., is operational). Further, when the fifth PTAT current I5 is less than the second predefined value, the CTAT circuit 204 is deactivated (i.e., is non-operational). Further, the third control voltage VC3 is equal to the threshold voltage associated with the CTAT circuit 204. The threshold voltage associated with the CTAT circuit 204 is a CTAT voltage. Thus, the third control voltage VC3 is a CTAT voltage.

The fourth and fifth resistors R4 and R5 each have first and second terminals. The fourth and fifth resistors R4 and R5 can be coupled in series with each other. In other words, the first terminals of the fourth and fifth resistors R4 and R5 can be coupled with each other. Further, the second terminal of the fifth resistor R5 can be coupled with the power supply 102, and configured to receive the supply voltage VDD. The second terminal of the fourth resistor R4 can be coupled with the third terminal of the sixth transistor T6. The coupling between the second terminal of the fourth resistor R4 and the third terminal of the sixth transistor T6 can be such that the sixth PTAT current I6 outputted by the third terminal of the sixth transistor T6 is sank from fourth resistor R4 (i.e., the second terminal of the fourth resistor R4). Based on the sixth PTAT current I6, the second terminal of the fourth resistor R4 can be further configured to generate a fourth control voltage VC4. The fourth control voltage VC4 is equal to a difference between the supply voltage VDD and a voltage drop across the fourth and fifth resistors R4 and R5. Thus, the fourth control voltage VC4 can be determined as shown below in equation (7):

$$VC4 = VDD - \frac{S4 * k * T * \ln(N) * (R4 + R5)}{q * R3} \quad (7)$$

where, $$\frac{S4 * k * T * \ln(N)}{q * R3}$$

is equal to the sixth PTAT current I6.

The fourth control voltage VC4 is thus a CTAT voltage.

The second switch SW2 has first and second data terminals that can be coupled with the first and second terminals of the fifth resistor R5, respectively. In other words, the second switch SW2 can be coupled in parallel with the fifth resistor R5. The second switch SW2 further has a control terminal that can be configured to receive the power-on reset signal PS. The power-on reset signal PS can control an operation of the second switch SW2. The second switch SW2 can correspond to a PMOS transistor, an NMOS transistor, a transmission gate, or the like. In an embodiment, the second switch SW2 is activated and deactivated when the power-on reset signal PS is activated and deactivated, respectively. When the second switch SW2 is activated, the fifth resistor R5 is bypassed (i.e., shorted). In such a scenario, the fourth control voltage VC4 can be determined as shown below in equation (8):

$$VC4 = VDD - \frac{S4 * k * T * \ln(N) * R4}{q * R3} \quad (8)$$

The comparator 206 can be coupled with the CTAT circuit 204 and the second terminal of the fourth resistor R4, and configured to receive the third and fourth control voltages VC3 and VC4, respectively. The comparator 206 can be further configured to compare the third and fourth control voltages VC3 and VC4 to generate the power-on reset signal PS. The power-on reset signal PS is activated when the fourth control voltage VC4 is greater than or equal to the third control voltage VC3. Further, the power-on reset signal PS is deactivated when the fourth control voltage VC4 is less than the third control voltage VC3. The comparator 206 can be further coupled with the functional circuit 106 and the control terminal of the second switch SW2, and further configured to provide the power-on reset signal PS to the functional circuit 106 and the control terminal of the second switch SW2.

In operation, when the electronic system 100 is powered up, the supply voltage VDD ramps up, thereby increasing the fourth control voltage VC4 (as shown in equation (7)). However, the fourth control voltage VC4 is less than that the third control voltage VC3 that is constant at a second predetermined voltage level (i.e., the threshold voltage associated with the CTAT circuit 204). Thus, the power-on reset signal PS is deactivated when the supply voltage VDD ramps up on the power-up of the electronic system 100. The comparator 206 can provide the power-on reset signal PS to the functional circuit 106 and the control terminal of the second switch SW2.

When the supply voltage VDD ramps up to a voltage level that is equal to the trip voltage, the fourth control voltage VC4 becomes equal to the third control voltage VC3. As a result, the power-on reset signal PS is activated. In such a scenario, the trip voltage can be determined as shown below in equation (9):

$$V_{trip} = VT + \frac{S4 * k * T * \ln(N) * (R4 + R5)}{q * R3} \quad (9)$$

The threshold voltage associated with the CTAT circuit 204 is a CTAT voltage (i.e., has a negative temperature co-efficient) whereas the voltage drop across the fourth and fifth resistors R4 and R5 is a PTAT voltage (i.e., has a positive temperature co-efficient). Thus, based on the resistance value of the third resistor R3, resistance values of the fourth and fifth resistors R4 and R5, the ratio of the sizes of the second and first transistors T2 and T1, and the fourth scaling factor 'S4', a temperature-independent trip voltage may be generated.

The functional circuit 106 can execute the reset operation associated therewith when the power-on reset signal PS transitions from a deactivated state to an activated state. Further, as the power-on reset signal PS is activated, the second switch SW2 is activated. As a result, the fifth resistor R5 is bypassed, and the fourth control voltage VC4 decreases (as shown in equation (8). In other words, the trip voltage decreases. This ensures that fluctuations in the supply voltage VDD do not result in erroneous toggling of the power-on reset signal PS. The power-on reset signal PS can then be deactivated when the supply voltage VDD ramps down and is equal to the reduced trip voltage.

Figure 2C:
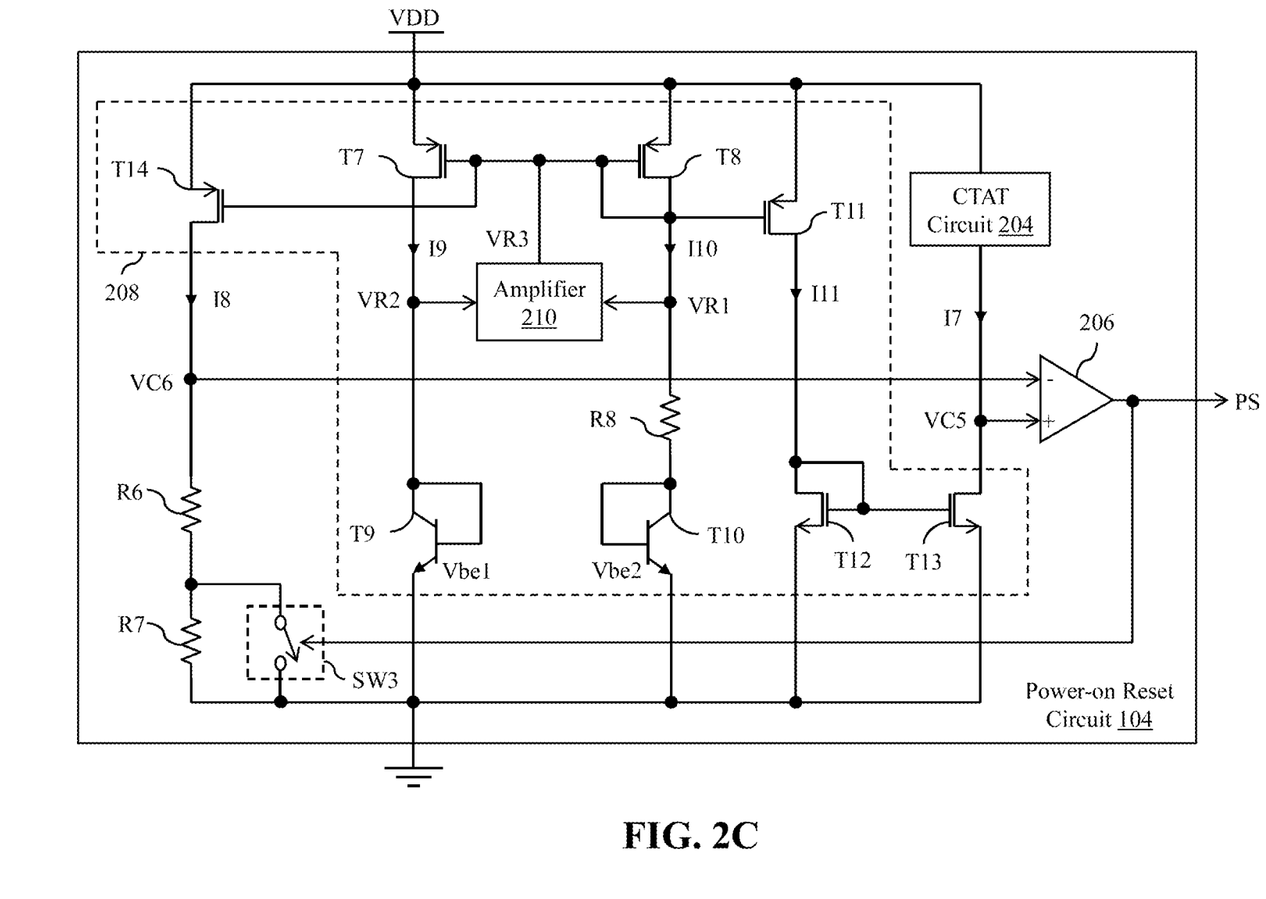
FIG. 2C illustrates a schematic circuit diagram of the power-on reset circuit in accordance with yet another embodiment of the present disclosure.

FIG. 2C illustrates a schematic circuit diagram of the power-on reset circuit 104 in accordance with yet another embodiment of the present disclosure. The power-on reset circuit 104 can include a second PTAT circuit 208, the CTAT circuit 204, sixth and seventh resistors R6 and R7, a third switch SW3, and the comparator 206.

The second PTAT circuit 208 can be configured to output seventh and eighth PTAT currents I7 and I8. The second PTAT circuit 208 can include an eighth resistor R8, an amplifier 210, and seventh through fourteenth transistors T7-T14.

The seventh and eighth transistors T7 and T8 each have first through third terminals. The first terminals of the seventh and eighth transistors T7 and T8 can be coupled with the power supply 102, and configured to receive the supply voltage VDD. The second terminal of the seventh transistor T7 can be coupled with the second and third terminals of the eighth transistor T8. Further, the third terminals of the seventh and eighth transistors T7 and T8 can be configured to output ninth and tenth PTAT currents I9 and I10, respectively. In an embodiment, the seventh and eighth transistors T7 and T8 are PMOS transistors, and the first through third terminals of the seventh and eighth transistors T7 and T8 correspond to source, gate, and drain terminals, respectively. The seventh and eighth transistors T7 and T8 thus form a fifth current mirror. Further, sizes of the seventh and eighth transistors T7 and T8 are equal. Thus, the ninth and tenth PTAT currents I9 and I10 are equal.

The ninth and tenth transistors T9 and T10 each have first through third terminals. The first terminals of the ninth and tenth transistors T9 and T10 can be coupled with the ground terminal. Further, the second terminal of the ninth transistor T9 can be coupled with the third terminals of the ninth and seventh transistors T9 and T7, and the second terminal of the tenth transistor T10 can be coupled with the third terminal of the tenth transistor T10. In an embodiment, the ninth and tenth transistors T9 and T10 are NPN transistors, and the first through third terminals of the ninth and tenth transistors T9 and T10 correspond to emitter, base, and collector terminals, respectively. Each of the ninth and tenth transistors T9 and T10 thus corresponds to a diode-connected transistor. Further, a size of the tenth transistor T10 is 'M' times a size of the ninth transistor T9. In an embodiment, 'M' is greater than one.

As the second and first terminals of the ninth and tenth transistors T9 and T10 correspond to base and emitter terminals, respectively, it will be apparent to a person skilled in the art that base-emitter voltages can be generated at junctions between the second and first terminals of the ninth and tenth transistors T9 and T10. For example, a first base-emitter voltage Vbe1 can be generated at a junction between the second and first terminals of the ninth transistor T9. Similarly, a second base-emitter voltage Vbe2 can be generated at a junction between the second and first terminals of the tenth transistor T10.

The eighth resistor R8 has first and second terminals that can be coupled with the third terminals of the eighth and tenth transistors T8 and T10, respectively. In other words, the eighth resistor R8 can be coupled between the third terminals of the eighth and tenth transistors T8 and T10. The first terminal of the eighth resistor R8 can be further configured to generate a first reference voltage VR1.

The amplifier 210 can be coupled with the eighth resistor R8 (i.e., the first terminal of the eighth resistor R8), the third terminal of the ninth transistor T9, and the second terminals of the seventh and eighth transistors T7 and T8. The amplifier 210 can include suitable circuitry that can be configured to perform one or more operations. For example, the amplifier 210 can be configured to receive the first reference voltage VR1 and a second reference voltage VR2 from the first terminal of the eighth resistor R8 and the third terminal of the ninth transistor T9, respectively, and generate a third reference voltage VR3. The second reference voltage VR2 can correspond to the first base-emitter voltage Vbe1 of the ninth transistor T9. The amplifier 210 can be further configured to provide the third reference voltage VR3 to the second terminals of the seventh and eighth transistors T7 and T8.

The amplifier 210 is coupled in a negative feedback configuration. In such a scenario, the amplifier 210 can drive the first and second reference voltages VR1 and VR2 to be equal. The first reference voltage VR1 can thus be equal to the first base-emitter voltage Vbe1. The voltage drop across the eighth resistor R8 can thus be equal to a difference between the first base-emitter voltage Vbe1 of the ninth transistor T9 and the second base-emitter voltage Vbe2 of the tenth transistor T10. The difference between the first and second base-emitter voltages Vbe1 and Vbe2 is a PTAT voltage (i.e., has a positive temperature co-efficient). Thus, a current passing through the eighth resistor R8 is a PTAT current. The tenth PTAT current I10 can thus be outputted, and can be determined as shown below in equation (10):

$$I10 = \frac{\Delta Vbe}{R8} \qquad (10)$$

where,

ΔVbe is the difference between the first and second base-emitter voltages Vbe1 and Vbe2.

The eleventh transistor T11 has a first terminal that can be coupled with the power supply 102, and configured to receive the supply voltage VDD, and a second terminal that can be coupled with the second and third terminals of the eighth transistor T8. The eleventh transistor T11 further has a third terminal that can be configured to output an eleventh PTAT current I11. In an embodiment, the eleventh transistor T11 is a PMOS transistor, and the first through third terminals of the eleventh transistor T11 correspond to source, gate, and drain terminals, respectively. The eighth and eleventh transistors T8 and T11 thus form a sixth current mirror. Further, a size of the eleventh transistor T11 is same as that of the eighth transistor T8. Thus, the eleventh PTAT current I11 is equal to the tenth PTAT current I10.

The twelfth transistor T12 has a first terminal that can be coupled with the ground terminal and second and third terminals that can be coupled with the third terminal of the eleventh transistor T11. The thirteenth transistor T13 has a first terminal that can be coupled with the ground terminal, and a second terminal that can be coupled with the second terminal of the twelfth transistor T12. The thirteenth transistor T13 further has a third terminal that can be coupled with the CTAT circuit 204, and configured to output the seventh PTAT current I7 such that the seventh PTAT current I7 is sank from the CTAT circuit 204. In an embodiment, the twelfth and thirteenth transistors T12 and T13 are NMOS transistors, and the first through third terminals of the twelfth and thirteenth transistors T12 and T13 correspond to source, gate, and drain terminals, respectively. The twelfth and thirteenth transistors T12 and T13 thus form a seventh current mirror. Further, a size of the thirteenth transistor T13 is different than a size of the twelfth transistor T12. Thus, the seventh PTAT current I7 can be a scaled version of the eleventh PTAT current I11. For the sake of ongoing discussion, it is assumed that the seventh PTAT current I7 is 'S5' times the eleventh PTAT current I11, where 'S5' is a fifth scaling factor. In one embodiment, the fifth scaling factor 'S5' is less than one. In another embodiment, the fifth scaling factor 'S5' is greater than one.

The fourteenth transistor T14 has a first terminal that can be coupled with the power supply 102, and configured to receive the supply voltage VDD, and a second terminal that can be coupled with the second terminal of the seventh transistor T7. The fourteenth transistor T14 further has a third terminal that can be coupled with the sixth resistor R6, and configured to output and provide (i.e., source) the eighth PTAT current I8 to the sixth resistor R6. In an embodiment, the fourteenth transistor T14 is a PMOS transistor, and the first through third terminals of the fourteenth transistor T14 correspond to source, gate, and drain terminals, respectively. The seventh and fourteenth transistors T7 and T14 thus form an eighth current mirror. Further, a size of the fourteenth transistor T14 is different than a size of the seventh transistor T7. Thus, the eighth PTAT current I8 can be a scaled version of the ninth PTAT current I9. For the sake of ongoing discussion, it is assumed that the eighth PTAT current I8 is 'S6' times the ninth PTAT current I9, where 'S6' is a sixth scaling factor. In one embodiment, the sixth scaling factor 'S6' is less than one. In another embodiment, the sixth scaling factor 'S6' is greater than one.

The CTAT circuit 204 can be coupled with the power supply 102, and configured to receive the supply voltage VDD. The CTAT circuit 204 can be further coupled with the third terminal of the thirteenth transistor T13. The coupling between the third terminal of the thirteenth transistor T13 and the CTAT circuit 204 can be such that the seventh PTAT current I7 outputted by the third terminal of the thirteenth transistor T13 is sank from the CTAT circuit 204. Based on the seventh PTAT current I7 and the supply voltage VDD, the CTAT circuit 204 can be configured to output a fifth control voltage VC5. In such a scenario, the seventh PTAT current I7 can correspond to a biasing current that controls an operation of the CTAT circuit 204. In an embodiment, when the seventh PTAT current I7 is greater than or equal to a third predefined value (not shown), the CTAT circuit 204 is activated (i.e., is operational). Further, when the seventh PTAT current I7 is less than the third predefined value, the CTAT circuit 204 is deactivated (i.e., is non-operational). Further, the fifth control voltage VC5 is equal to a difference between the supply voltage VDD and the threshold voltage associated with the CTAT circuit 204. The fifth control voltage VC5 is determined as shown below in equation (11):

$$VC5 = VDD - VT \qquad (11)$$

The threshold voltage associated with the CTAT circuit 204 is a CTAT voltage. Thus, the fifth control voltage VC5 is a PTAT voltage.

The sixth and seventh resistors R6 and R7 each have first and second terminals. The sixth and seventh resistors R6 and R7 can be coupled in series with each other. In other words, the first terminals of the sixth and seventh resistors R6 and R7 can be coupled with each other. Further, the second terminal of the seventh resistor R7 can be coupled with the ground terminal. The second terminal of the sixth resistor R6 can be coupled with the third terminal of the fourteenth transistor T14, and configured to receive the eighth PTAT current I8 and generate a sixth control voltage VC6. The sixth control voltage VC6 can be determined as shown below in equation (12):

$$VC6 = \frac{S6 * \Delta Vbe * (R6 + R7)}{R8} \qquad (12)$$

where, $$\frac{S6 * \Delta Vbe}{R8}$$

is equal to the eighth PTAT current I8.

The difference between the first and second base-emitter voltages Vbe1 and Vbe2 (i.e., ΔVbe) is a PTAT voltage. Hence, the sixth control voltage VC6 is a PTAT voltage.

The third switch SW3 has first and second data terminals that can be coupled with the first and second terminals of the seventh resistor R7, respectively. In other words, the third switch SW3 can be coupled in parallel with the seventh resistor R7. The third switch SW3 further has a control terminal that can be configured to receive the power-on reset signal PS. The power-on reset signal PS can control an operation of the third switch SW3. The third switch SW3 can correspond to a PMOS transistor, an NMOS transistor, a transmission gate, or the like. In an embodiment, the third switch SW3 is activated and deactivated when the power-on reset signal PS is activated and deactivated, respectively. When the third switch SW3 is activated, the seventh resistor R7 is bypassed (i.e., shorted). In such a scenario, the sixth control voltage VC6 can be determined as shown below in equation (13):

$$VC6 = \frac{S6 * \Delta Vbe * R6}{R8} \quad (13)$$

The comparator 206 can be coupled with the CTAT circuit 204 and the second terminal of the sixth resistor R6, and configured to receive the fifth and sixth control voltages VC5 and VC6, respectively. The comparator 206 can be further configured to compare the fifth and sixth control voltages VC5 and VC6 to generate the power-on reset signal PS. The power-on reset signal PS is activated when the fifth control voltage VC5 is greater than or equal to the sixth control voltage VC6. Further, the power-on reset signal PS is deactivated when the fifth control voltage VC5 is less than the sixth control voltage VC6. The comparator 206 can be further coupled with the functional circuit 106 and the control terminal of the third switch SW3, and further configured to provide the power-on reset signal PS to the functional circuit 106 and the control terminal of the third switch SW3.

In operation, when the electronic system 100 is powered up, the supply voltage VDD ramps up, thereby increasing the fifth control voltage VC5 (as shown in equation (11)). However, the fifth control voltage VC5 is less than the sixth control voltage VC6 that is constant at a third predetermined voltage level (as shown in equation (12)). Thus, the power-on reset signal PS is deactivated. The comparator 206 can provide the power-on reset signal PS to the functional circuit 106 and the control terminal of the third switch SW3.

When the supply voltage VDD ramps up to a voltage level that is equal to the trip voltage, the fifth control voltage VC5 becomes equal to the sixth control voltage VC6. As a result, the power-on reset signal PS is activated. In such a scenario, based on equations (11) and (12), the trip voltage can be determined as shown below in equation (14):

$$V_{trip} = VT + \frac{S6 * \Delta Vbe * (R6 + R7)}{R8} \quad (14)$$

The threshold voltage associated with the CTAT circuit 204 is a CTAT voltage (i.e., has a negative temperature co-efficient) whereas the sixth control voltage VC6 is a PTAT voltage (i.e., has a positive temperature co-efficient). Thus, based on resistance values of the sixth through eighth resistors R6-R8 and the sixth scaling factor 'S6', a temperature-independent trip voltage may be generated.

The functional circuit 106 can execute the reset operation associated therewith when the power-on reset signal PS transitions from a deactivated state to an activated state. Further, as the power-on reset signal PS is activated, the third switch SW3 is activated. As a result, the seventh resistor R7 is bypassed, and the sixth control voltage VC6 decreases (as shown in equation (13)). In other words, the trip voltage decreases. This ensures that fluctuations in the supply voltage VDD do not result in erroneous toggling of the power-on reset signal PS. The power-on reset signal PS can then be deactivated when the supply voltage VDD ramps down and is equal to the reduced trip voltage.

Figure 2D:
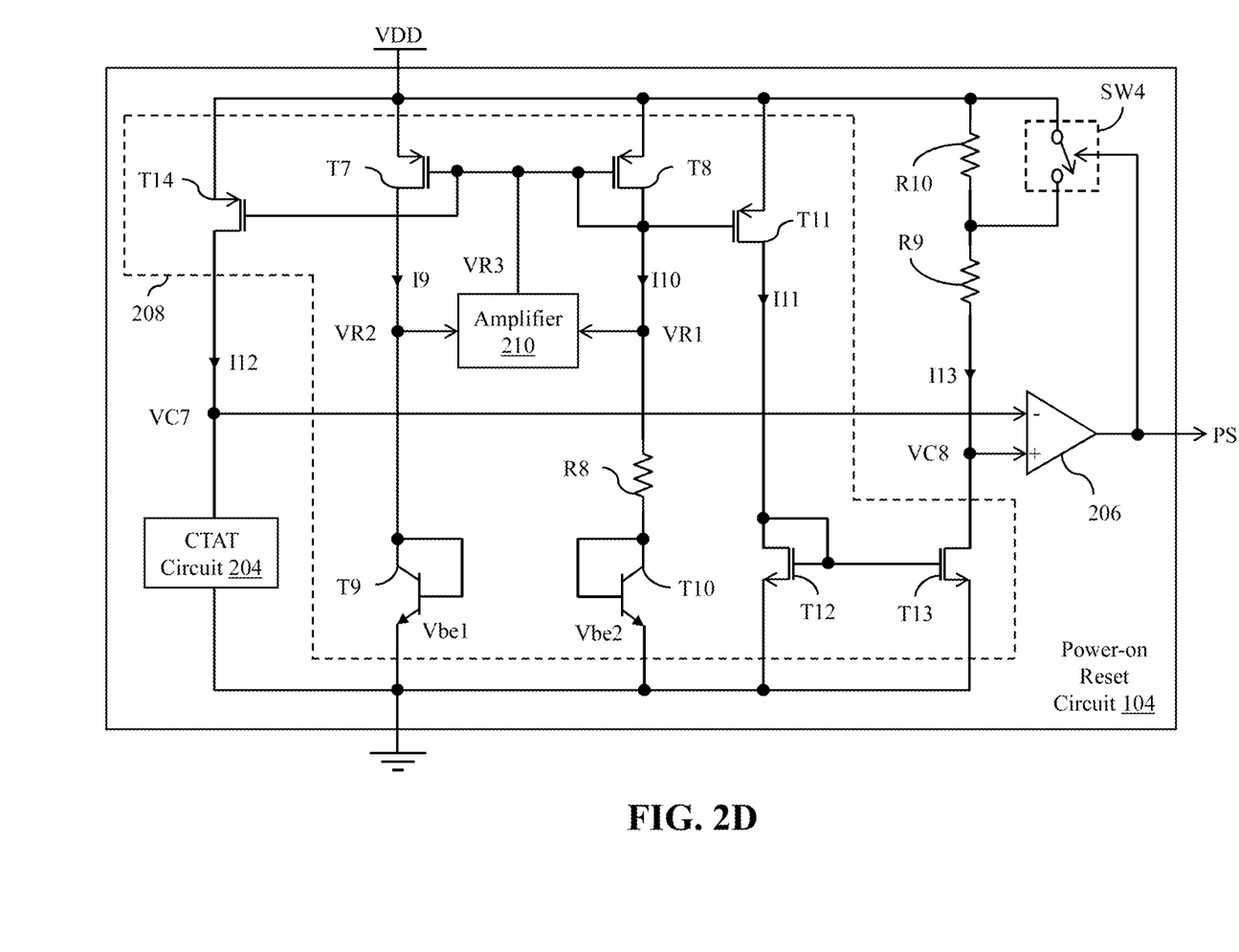
FIG. 2D illustrates a schematic circuit diagram of the power-on reset circuit in accordance with yet another embodiment of the present disclosure.

FIG. 2D illustrates a schematic circuit diagram of the power-on reset circuit 104 in accordance with yet another embodiment of the present disclosure. The power-on reset circuit 104 can include the second PTAT circuit 208, the CTAT circuit 204, ninth and tenth resistors R9 and R10, a fourth switch SW4, and the comparator 206.

The second PTAT circuit 208 can be configured to output twelfth and thirteenth PTAT currents I12 and I13. The second PTAT circuit 208 can include the eighth resistor R8, the amplifier 210, and the seventh through fourteenth transistors T7-T14.

The first terminals of the seventh and eighth transistors T7 and T8 can be coupled with the power supply 102, and configured to receive the supply voltage VDD. The second terminal of the seventh transistor T7 can be coupled with the second and third terminals of the eighth transistor T8. Further, the third terminals of the seventh and eighth transistors T7 and T8 can be configured to output the ninth and tenth PTAT currents I9 and I10, respectively. In an embodiment, the ninth and tenth PTAT currents I9 and I10 are equal. The first terminals of the ninth and tenth transistors T9 and T10 can be coupled with the ground terminal. Further, the second terminal of the ninth transistor T9 can be coupled with the third terminals of the ninth and seventh transistors T9 and T7, and the second terminal of the tenth transistor T10 can be coupled with the third terminal of the tenth transistor T10.

The first and second terminals of the eighth resistor R8 can be coupled with the third terminals of the eighth and tenth transistors T8 and T10, respectively. In other words, the eighth resistor R8 can be coupled between the third terminals of the eighth and tenth transistors T8 and T10. The first terminal of the eighth resistor R8 can be further configured to generate the first reference voltage VR1. The amplifier 210 can be coupled with the first terminal of the eighth resistor R8 and the third terminal of the ninth transistor T9, and configured to receive the first reference voltage VR1 and the second reference voltage VR2, respectively, and generate the third reference voltage VR3. The second reference voltage VR2 corresponds to the first base-emitter voltage Vbe1 of the ninth transistor T9. The amplifier 210 can be further coupled with the second terminals of the seventh and eighth transistors T7 and T8, and further configured to provide the third reference voltage VR3 to the second terminals of the seventh and eighth transistors T7 and T8.

The amplifier 210 is coupled in a negative feedback configuration. In such a scenario, the amplifier 210 can drive the first and second reference voltages VR1 and VR2 to be equal. The voltage drop across the eighth resistor R8 can thus be equal to the difference between the first and second base-emitter voltages Vbe1 and Vbe2. As the difference between the first and second base-emitter voltages Vbe1 and Vbe2 is a PTAT voltage, a current passing through the eighth resistor R8 is a PTAT current. The tenth PTAT current I10 can be thus outputted.

The first terminal of the eleventh transistor T11 can be coupled with the power supply 102, and configured to receive the supply voltage VDD, and the second terminal of the eleventh transistor T11 can be coupled with the second and third terminals of the eighth transistor T8. Further, the third terminal of the eleventh transistor T11 can be configured to output the eleventh PTAT current I11. The eighth and eleventh transistors T8 and T11 thus form the sixth current mirror. Further, the sizes of the eighth and eleventh transistors T8 and T11 are equal. Thus, the eleventh PTAT current I11 is equal to the tenth PTAT current I10.

The first terminal of the twelfth transistor T12 can be coupled with the ground terminal and the second and third terminals of the twelfth transistor T12 can be coupled with the third terminal of the eleventh transistor T11. The first terminal of the thirteenth transistor T13 can be coupled with the ground terminal, and the second terminal of the thirteenth transistor T13 can be coupled with the second terminal of the twelfth transistor T12. Further, the third terminal of the thirteenth transistor T13 can be coupled with the ninth resistor R9, and configured to output the thirteenth PTAT current I13 such that the thirteenth PTAT current I13 is sank from the ninth resistor R9. The twelfth and thirteenth transistors T12 and T13 thus form the seventh current mirror. Further, the size of the thirteenth transistor T13 is different than the size of the twelfth transistor T12. Thus, the thirteenth PTAT current I13 can be a scaled version of the eleventh PTAT current I11. For the sake of ongoing discussion, it is assumed that the thirteenth PTAT current I13 is 'S7' times the eleventh PTAT current I11, where 'S7' is a seventh scaling factor. In one embodiment, the seventh scaling factor 'S7' is less than one. In another embodiment, the seventh scaling factor 'S7' is greater than one.

The first terminal of the fourteenth transistor T14 can be coupled with the power supply 102, and configured to receive the supply voltage VDD. The second terminal of the fourteenth transistor T14 can be coupled with the second terminal of the seventh transistor T7. Further, the third terminal of the fourteenth transistor T14 can be coupled with the CTAT circuit 204, and configured to output and provide (i.e., source) the twelfth PTAT current I12 to the CTAT circuit 204. The seventh and fourteenth transistors T7 and T14 thus form the eighth current mirror. Further, the size of the fourteenth transistor T14 is different than the size of the seventh transistor T7. Thus, the twelfth PTAT current I12 can be a scaled version of the ninth PTAT current I9. For the sake of ongoing discussion, it is assumed that the twelfth PTAT current I12 is 'S8' times the ninth PTAT current I9, where 'S8' is an eighth scaling factor. In one embodiment, the eighth scaling factor 'S8' is less than one. In another embodiment, the eighth scaling factor 'S8' is greater than one.

The CTAT circuit 204 can be coupled between the third terminal of the fourteenth transistor T14 and the ground terminal, and configured to receive the twelfth PTAT current I12 and output a seventh control voltage VC7. In such a scenario, the twelfth PTAT current I12 can correspond to a biasing current that controls an operation of the CTAT circuit 204. In an embodiment, when the twelfth PTAT current I12 is greater than or equal to a fourth predefined value (not shown), the CTAT circuit 204 is activated (i.e., is operational). Further, when the twelfth PTAT current I12 is less than the fourth predefined value, the CTAT circuit 204 is deactivated (i.e., is non-operational). Further, the seventh control voltage VC7 is equal to the threshold voltage associated with the CTAT circuit 204. The threshold voltage associated with the CTAT circuit 204 is a CTAT voltage. Thus, the seventh control voltage VC7 is a CTAT voltage.

The ninth and tenth resistors R9 and R10 each have first and second terminals. The ninth and tenth resistors R9 and R10 can be coupled in series with each other. In other words, the first terminals of the ninth and tenth resistors R9 and R10 can be coupled with each other. Further, the second terminal of the tenth resistor R10 can be coupled with the power supply 102, and configured to receive the supply voltage VDD. The second terminal of the ninth resistor R9 can be coupled with the third terminal of the thirteenth transistor T13. The coupling between the third terminal of the thirteenth transistor T13 and the second terminal of the ninth resistor R9 can be such that the thirteenth PTAT current I13 is sank from the second terminal of the ninth resistor R9. Based on the thirteenth PTAT current I13, the second terminal of the ninth resistor R9 can be further configured to generate an eighth control voltage VC8. The eighth control voltage VC8 is equal to a difference between the supply voltage VDD and a voltage drop across the ninth and tenth resistors R9 and R10. The eighth control voltage VC8 can be determined as shown below in equation (15):

$$VC8 = VDD - \frac{S7 * \Delta Vbe * (R9 + R10)}{R8} \quad (15)$$

where, $$\frac{S7 * \Delta Vbe}{R8}$$

is equal to the thirteenth PTAT current I13.

The difference between the first and second base-emitter voltages Vbe1 and Vbe2 (i.e., ΔVbe) is a PTAT voltage. Hence, the eighth control voltage VC8 is a CTAT voltage.

The fourth switch SW4 has first and second data terminals that can be coupled with the first and second terminals of the tenth resistor R10, respectively. In other words, the fourth switch SW4 can be coupled in parallel with the tenth resistor R10. The fourth switch SW4 further has a control terminal that can be configured to receive the power-on reset signal PS. The power-on reset signal PS can control an operation of the fourth switch SW4. The fourth switch SW4 can correspond to a PMOS transistor, an NMOS transistor, a transmission gate, or the like. In an embodiment, the fourth switch SW4 is activated and deactivated when the power-on reset signal PS is activated and deactivated, respectively. When the fourth switch SW4 is activated, the tenth resistor R10 is bypassed (i.e., shorted). In such a scenario, the eighth control voltage VC8 can be determined as shown below in equation (16):

$$VC8 = VDD - \frac{S7 * \Delta Vbe * R9}{R8} \quad (16)$$

The comparator 206 can be coupled with the CTAT circuit 204 and the second terminal of the ninth resistor R9, and configured to receive the seventh and eighth control voltages VC7 and VC8, respectively. The comparator 206 can be further configured to compare the seventh and eighth control voltages VC7 and VC8 to generate the power-on reset signal PS. The power-on reset signal PS is activated when the eighth control voltage VC8 is greater than or equal to the seventh control voltage VC7. Further, the power-on reset signal PS is deactivated when the eighth control voltage VC8 is less than the seventh control voltage VC7. The comparator 206 can be further coupled with the functional circuit 106 and the control terminal of the fourth switch SW4, and further configured to provide the power-on reset signal PS to the functional circuit 106 and the control terminal of the fourth switch SW4.

In operation, when the electronic system 100 is powered up, the supply voltage VDD ramps up, thereby increasing the eighth control voltage VC8 (as shown in equation (15)).

However, the eighth control voltage VC8 is less than the seventh control voltage VC7 that is constant at a fourth predetermined voltage level (i.e., the threshold voltage associated with the CTAT circuit 204). Thus, the power-on reset signal PS is deactivated. The comparator 206 can then provide the power-on reset signal PS to the functional circuit 106 and the control terminal of the fourth switch SW4.

When the supply voltage VDD ramps up to a voltage level that is equal to the trip voltage, the eighth control voltage VC8 becomes equal to the seventh control voltage VC7. As a result, the power-on reset signal PS is activated. In such a scenario, based on equation (15), the trip voltage can be determined as shown below in equation (17):

$$V_{trip} = VT + \frac{S7 * \Delta Vbe * (R9 + R10)}{R8} \quad (17)$$

The threshold voltage associated with the CTAT circuit 204 is a CTAT voltage (i.e., has a negative temperature co-efficient) whereas the difference between the first and second base-emitter voltages Vbe1 and Vbe2 (i.e., ΔVbe) is a PTAT voltage (i.e., has a positive temperature co-efficient). Thus, based on the resistance value of the eighth resistor R8, resistance values of the ninth and tenth resistors R9 and R10, and the seventh scaling factor 'S7', a temperature-independent trip voltage may be generated.

The functional circuit 106 can then execute the reset operation associated therewith when the power-on reset signal PS transitions from a deactivated state to an activated state. Further, as the power-on reset signal PS is activated, the fourth switch SW4 is activated. As a result, the tenth resistor R10 is bypassed, and the eighth control voltage VC8 decreases (as shown in equation (16)). Consequently, the trip voltage decreases. This ensures that fluctuations in the supply voltage VDD do not result in erroneous toggling of the power-on reset signal PS. The power-on reset signal PS can then be deactivated when the supply voltage VDD ramps down and is equal to the reduced trip voltage.

Although the power-on reset circuit 104 is shown to include two types of PTAT circuits (the first PTAT circuit 202 of FIGS. 2A and 2B, and the second PTAT circuit 208 of FIGS. 2C and 2D), it will be apparent to a person skilled in the art that the scope of the present disclosure is not limited to it. In various other embodiments, the power-on reset circuit 104 can include various different implementations of PTAT circuits to output PTAT currents, without deviating from the scope of the present disclosure.

Thus, the power-on reset circuit 104 can generate the power-on reset signal PS for facilitating the reset of the functional circuit 106 when the supply voltage VDD is equal to the trip voltage. The first and second PTAT circuits 202 and 208 ensure that a current in the power-on reset circuit 104 (e.g., the fourth and tenth PTAT currents I4 and I10) is independent of the supply voltage VDD. In other words, an increase in the supply voltage VDD does not result in an increase in the current in the power-on reset circuit 104. As a result, a need to implement various current compensation techniques to compensate for any additional current in the power-on reset circuit 104 is eliminated. Hence, a size and a manufacturing cost of the power-on reset circuit 104 of the present disclosure are significantly less than that of a conventional power-on reset circuit that requires resistors of significant resistance values to compensate for an increased current therein that is a result of an increase in the supply voltage VDD. Consequently, a size and a manufacturing cost of the electronic system 100 that includes the power-on reset circuit 104 of the present disclosure are significantly less than that of an electronic system that includes the conventional power-on reset circuit. Thus, the power-on reset circuit 104 of the present disclosure can operate across various voltage levels of the supply voltage VDD (e.g., 1.8 volts-5 volts).

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A power-on reset circuit comprising: a complementary-to-absolute-temperature (CTAT) circuit that is configured to output a first control voltage; a proportional-to-absolute-temperature (PTAT) circuit that is configured to output a first PTAT current; and a comparator that is coupled with the CTAT circuit, and configured to receive the first control voltage, and a second control voltage that is generated based on the first PTAT current, and compare the first and second control voltages to generate a power-on reset signal; wherein the PTAT circuit comprises:

a first resistor that is configured to receive a supply voltage;

first and second transistors each having first through third terminals, wherein the first terminal of the first transistor is configured to receive the supply voltage and the first terminal of the second transistor is coupled with the first resistor, wherein the second terminal of the second transistor is coupled with the second and third terminals of the first transistor, and wherein the third terminals of the first and second transistors are configured to output second and third PTAT currents, respectively;

third and fourth transistors each having first through third terminals, wherein the first terminals of the third and fourth transistors are coupled with a ground terminal, and the second terminal of the third transistor is coupled with the second and third terminals of the fourth transistor, and wherein the third terminals of the third and fourth transistors are coupled with the third terminals of the first and second transistors, respectively; and fifth and sixth transistors each having first through third terminals, wherein the second terminals of the fifth and sixth transistors are coupled with the second terminals of the first and fourth transistors, respectively, and wherein the first terminal of the fifth transistor is configured to receive the supply voltage, and the first terminal of the sixth transistor is coupled with the ground terminal.

2. The power-on reset circuit of claim 1, wherein the CTAT circuit corresponds to one of a diode and a diode-connected transistor.

3. The power-on reset circuit of claim 1, wherein:
the third terminals of the fifth and sixth transistors are configured to output the first PTAT current and a fourth PTAT current, respectively,
the first and fourth PTAT currents are scaled versions of the second and third PTAT currents, respectively, the third terminal of the sixth transistor is coupled with the CTAT circuit, and outputs the fourth PTAT current such that the fourth PTAT current is sank from the CTAT circuit, the CTAT circuit is configured to receive the supply voltage, and the CTAT circuit outputs the first control voltage based on the supply voltage and the fourth PTAT current.

4. The power-on reset circuit of claim 3, further comprising second and third resistors coupled in series with each other, wherein the third resistor is further coupled with the ground terminal, and wherein the second resistor is further coupled with the third terminal of the fifth transistor, and configured to receive the first PTAT current and generate the second control voltage.

5. The power-on reset circuit of claim 4, further comprising a first switch coupled in parallel with the third resistor, wherein the first switch is further coupled with the comparator, and configured to receive the power-on reset signal, wherein the first switch is (i) activated when the power-on reset signal is activated, and (ii) deactivated when the power-on reset signal is deactivated, and wherein the power-on reset signal is (i) activated when the first control voltage is greater than or equal to the second control voltage, and (ii) deactivated when the first control voltage is less than the second control voltage.

6. The power-on reset circuit of claim 1, wherein:
the third terminals of the fifth and sixth transistors are configured to output a fifth PTAT current and the first PTAT current, respectively,
the fifth and first PTAT currents are scaled versions of the second and third PTAT currents, respectively,
the third terminal of the fifth transistor is coupled with the CTAT circuit, and further configured to provide the fifth PTAT current to the CTAT circuit, and
the CTAT circuit outputs the first control voltage based on the fifth PTAT current.

7. The power-on reset circuit of claim 6, further comprising fourth and fifth resistors coupled in series with each other, wherein the fifth resistor is configured to receive the supply voltage, and the fourth resistor is further coupled with the third terminal of the sixth transistor, wherein the third terminal of the sixth transistor outputs the first PTAT current such that the first PTAT current is sank from the fourth resistor, and wherein the fourth resistor is configured to generate the second control voltage based on the first PTAT current.

8. The power-on reset circuit of claim 7, further comprising a second switch coupled in parallel with the fifth resistor, wherein the second switch is further coupled with the comparator, and configured to receive the power-on reset signal, wherein the second switch is (i) activated when the power-on reset signal is activated, and (ii) deactivated when the power-on reset signal is deactivated, and wherein the power-on reset signal is (i) activated when the second control voltage is greater than or equal to the first control voltage, and (ii) deactivated when the second control voltage is less than the first control voltage.

9. A power-on reset circuit comprising: a complementary-to-absolute-temperature (CTAT) circuit that is configured to output a first control voltage; a proportional-to-absolute-temperature (PTAT) circuit that is configured to output a first PTAT current; and a comparator that is coupled with the CTAT circuit, and configured to receive the first control voltage, and a second control voltage that is generated based on the first PTAT current, and compare the first and second control voltages to generate a power-on reset signal; wherein the PTAT circuit comprises:

seventh and eighth transistors each having first through third terminals, wherein the first terminals of the seventh and eighth transistors are configured to receive a supply voltage, and the second terminal of the seventh transistor is coupled with the second and third terminals of the eighth transistor, and wherein the third terminals of the seventh and eighth transistors are configured to output sixth and seventh PTAT currents, respectively;

ninth and tenth transistors each having first through third terminals, wherein the first terminals of the ninth and tenth transistors are coupled with a ground terminal, and wherein the second terminal of the ninth transistor is coupled with the third terminals of the ninth and seventh transistors, and the second terminal of the tenth transistor is coupled with the third terminal of the tenth transistor;

a sixth resistor that is coupled between the third terminals of the eighth and tenth transistors, and configured to generate a first reference voltage; and an amplifier that is coupled with the sixth resistor and the third terminal of the ninth transistor, and configured to receive the first reference voltage and a second reference voltage, respectively, and generate a third reference voltage, wherein the second reference voltage corresponds to a base-emitter voltage of the ninth transistor, and wherein the amplifier is further coupled with the second terminals of the seventh and eighth transistors, and configured to provide the third reference voltage to the second terminals of the seventh and eighth transistors.

10. The power-on reset circuit of claim 9, wherein the PTAT circuit further comprises:

an eleventh transistor that has (i) a first terminal configured to receive the supply voltage, (ii) a second terminal coupled with the second and third terminals of the eighth transistor, and (iii) a third terminal configured to output an eighth PTAT current;

a twelfth transistor that has a first terminal coupled with the ground terminal and second and third terminals coupled with the third terminal of the eleventh transistor; and thirteenth and fourteenth transistors each having first through third terminals, wherein the second terminals of the thirteenth and fourteenth transistors are coupled with the second terminals of the twelfth and seventh transistors, respectively, and wherein the first terminal of the fourteenth transistor is configured to receive the supply voltage, and the first terminal of the thirteenth transistor is coupled with the ground terminal.

11. The power-on reset circuit of claim 10, wherein:
the third terminals of the thirteenth and fourteenth transistors are configured to output a ninth PTAT current and the first PTAT current, respectively,
the ninth and first PTAT currents are scaled versions of the eighth and sixth PTAT currents, respectively,
the third terminal of the thirteenth transistor is coupled with the CTAT circuit, and outputs the ninth PTAT current such that the ninth PTAT current is sank from the CTAT circuit,
the CTAT circuit is configured to receive the supply voltage, and
the CTAT circuit outputs the first control voltage based on the ninth PTAT current and the supply voltage.

12. The power-on reset circuit of claim 11, further comprising seventh and eighth resistors coupled in series with each other, wherein the eighth resistor is further coupled with the ground terminal, and wherein the seventh resistor is further coupled with the third terminal of the fourteenth transistor, and configured to receive the first PTAT current and generate the second control voltage.

13. The power-on reset circuit of claim 12, further comprising a third switch that is coupled in parallel with the eighth resistor, wherein the third switch is further coupled with the comparator, and configured to receive the power-on reset signal, wherein the third switch is (i) activated when the power-on reset signal is activated, and (ii) deactivated when the power-on reset signal is deactivated, and wherein the power-on reset signal is (i) activated when the first control voltage is greater than or equal to the second control voltage, and (ii) deactivated when the first control voltage is less than the second control voltage.

14. The power-on reset circuit of claim 10, wherein:
the third terminals of the thirteenth and fourteenth transistors are configured to output the first PTAT current and a tenth PTAT current, respectively,
the first and tenth PTAT currents are scaled versions of the eighth and sixth PTAT currents, respectively,
the third terminal of the fourteenth transistor is coupled with the CTAT circuit, and further configured to provide the tenth PTAT current to the CTAT circuit, and
the CTAT circuit outputs the first control voltage based on the tenth PTAT current.

15. The power-on reset circuit of claim 14, further comprising ninth and tenth resistors coupled in series with each other, wherein the tenth resistor is configured to receive the supply voltage and the ninth resistor is further coupled with the third terminal of the thirteenth transistor, wherein the third terminal of the thirteenth transistor outputs the first PTAT current such that the first PTAT current is sank from the ninth resistor, and wherein the ninth resistor is configured to generate the second control voltage based on the first PTAT current.

16. The power-on reset circuit of claim 15, further comprising a fourth switch coupled in parallel with the tenth resistor, wherein the fourth switch is further coupled with the comparator, and configured to receive the power-on reset signal, wherein the fourth switch is (i) activated when the power-on reset signal is activated, and (ii) deactivated when the power-on reset signal is deactivated, and wherein the power-on reset signal is (i) activated when the second control voltage is greater than or equal to the first control voltage, and (ii) deactivated when the second control voltage is less than the first control voltage.

17. An electronic system, comprising:
a power-on reset circuit, comprising:
a complementary-to-absolute-temperature (CTAT) circuit that is configured to output a first control voltage;
a proportional-to-absolute-temperature (PTAT) circuit that is configured to output a first PTAT current; and
a comparator that is coupled with the CTAT circuit, and configured to receive the first control voltage and a second control voltage that is generated based on the first PTAT current, and compare the first and second control voltages to generate a power-on reset signal when the first control voltage is greater than the second control voltage; and
a functional circuit that is coupled with the power-on reset circuit, and configured to receive the power-on reset signal and execute a reset operation associated therewith; and
a switch of the power on-reset circuit that is configured to be closed based on the generated power-on reset signal to reduce the second control voltage and to be opened when the power-on reset signal is not generated.

18. The electronic system of claim 17, wherein the power-on reset signal is (i) activated when the first control voltage is greater than or equal to the second control voltage, and (ii) deactivated when the first control voltage is less than the second control voltage, and wherein the CTAT circuit corresponds to one of a diode and a diode-connected transistor.

19. The electronic system of claim 17, wherein the power-on reset signal is (i) activated when the second control voltage is greater than or equal to the first control voltage, and (ii) deactivated when the second control voltage is less than the first control voltage, and wherein the CTAT circuit corresponds to one of a diode and a diode-connected transistor.

* * * * *